United States Patent [19]
Tsai

[11] Patent Number: 5,825,219
[45] Date of Patent: Oct. 20, 1998

[54] FAST EDGE RATE SIGNAL DRIVER

[75] Inventor: Cheng-Hsien Tsai, Taipei, Taiwan

[73] Assignee: Silicon Integrated SyStem Corp., Hsin Chu, Taiwan

[21] Appl. No.: 803,964

[22] Filed: Feb. 21, 1997

[51] Int. Cl.[6] .............................. H03K 5/12; H03K 17/04
[52] U.S. Cl. ........................... 327/112; 327/384; 326/24; 326/83; 326/87
[58] Field of Search ..................................... 327/112, 379, 327/383, 389, 390, 391, 384, 395, 396, 400, 401; 326/82, 83, 86, 87, 21, 23, 24

[56] References Cited

U.S. PATENT DOCUMENTS

| | | | |
|---|---|---|---|
| 4,785,203 | 11/1988 | Nakamura | 326/87 |
| 5,109,166 | 4/1992 | Coburn et al. | 327/170 |
| 5,287,527 | 2/1994 | Delp et al. | 326/87 |
| 5,483,188 | 1/1996 | Frodsham | 327/170 |

Primary Examiner—Timothy P. Callahan
Assistant Examiner—T. T. Lam

[57] ABSTRACT

A method for asserting signals onto an output line connected to a passive external pull-up resistor by using a fast edge rate signal driver is provided. The fast edge rate signal driver has first, second and third pull-down predrivers, first, second and third pull-up predrivers, first and second delay elements, and first, second and third output devices, and a PMOS and an NMOS current controller, and each of the output devices has one output terminal coupled to each other forming the output line. The method includes the steps of: (1) applying an input signal to the control terminal of a PMOS current controller for turning ON the PMOS current controller, and to the first pull-down predriver such that a first trigger signal output from the first pull-down predriver applies to the first output device; (2) passing the input signal through the first delay element to generate a first delayed signal which applies to the second pull-down predriver, whereby a second trigger signal output from the second pull-down predriver applies to the second output device; (3) passing the first delayed signal through the second delay element to generate a second delayed signal which applies to the third pull-down predriver, whereby a third trigger signal output from the third pull-down predriver applies to the third output device.

18 Claims, 5 Drawing Sheets

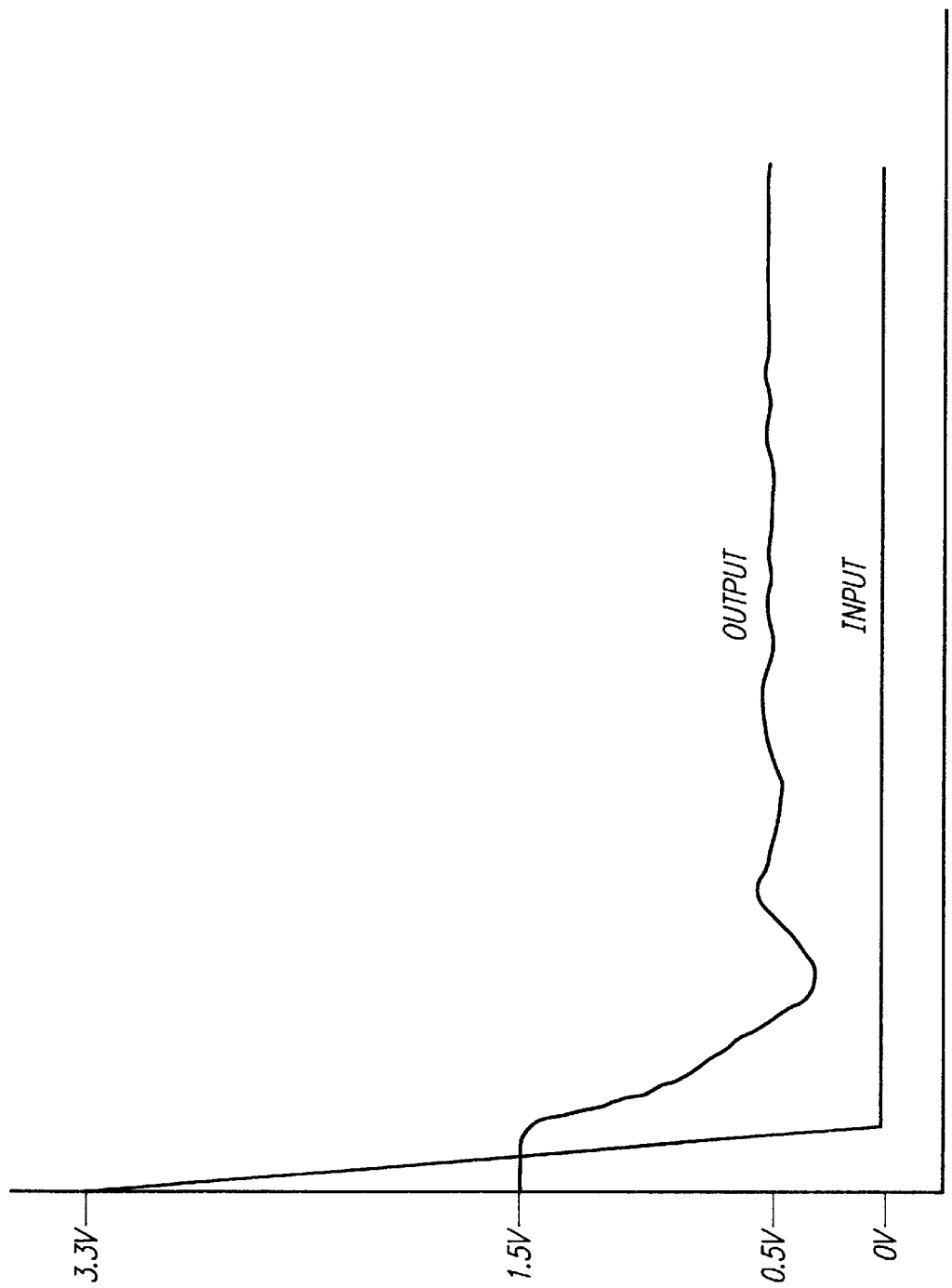

5,825,219

FAST EDGE RATE SIGNAL DRIVER

FIELD OF INVENTION

The invention relates to a computer bus system and particularly to an apparatus and method for driving fast edge rate signals onto a computer bus.

BACKGROUND OF INVENTION

To achieve fastest possible switching rates between logic low and logic high signals on a computer bus system while minimizing noise, conventional approaches have been provided. Among the conventional approaches is the U.S. Pat. No. 5,483,188 in which related art is recited in greater detail.

The main object of the instant invention is to provide an alternative approach to achieve fastest possible switching rates between logic low and logic high signals on a computer bus system while minimizing noise.

SUMMARY OF INVENTION

A fast edge rate signal driver including a delay element, N pull-down predrivers, N output devices, N pull-up predrivers, and two current controllers, is provided.

The delay element has N output terminals, responsive to the input signal, for generating N delayed signals.

N pull-down predrivers selectively-generate N trigger signals, and each of the N pull-down predrivers inputs one of N delayed signals and selectively generates a corresponding one of N trigger signals.

Each of N output devices is adapted to receive one of the trigger signals, and each of N output devices has one output terminal coupled to each other forming an output terminal of the fast edge rate signal driver.

N pull-up predrivers selectively generate N trigger signals, and each of the N pull-up predrivers inputs one of N delayed signals and selectively generates a corresponding one of N trigger signals.

The pull-down predrivers selectively sequentially trigger activation of the N output devices in a first order and the pull-up predrivers selectively sequentially trigger de-activation of the N output devices in a second order.

BRIEF DESCRIPTION OF THE APPENDED DRAWINGS

FIG. 3 (B) illustrates the output signal during a pull up phase of the input signal.

DETAILED DESCRIPTION OF THE INVENTION

Figure 1:
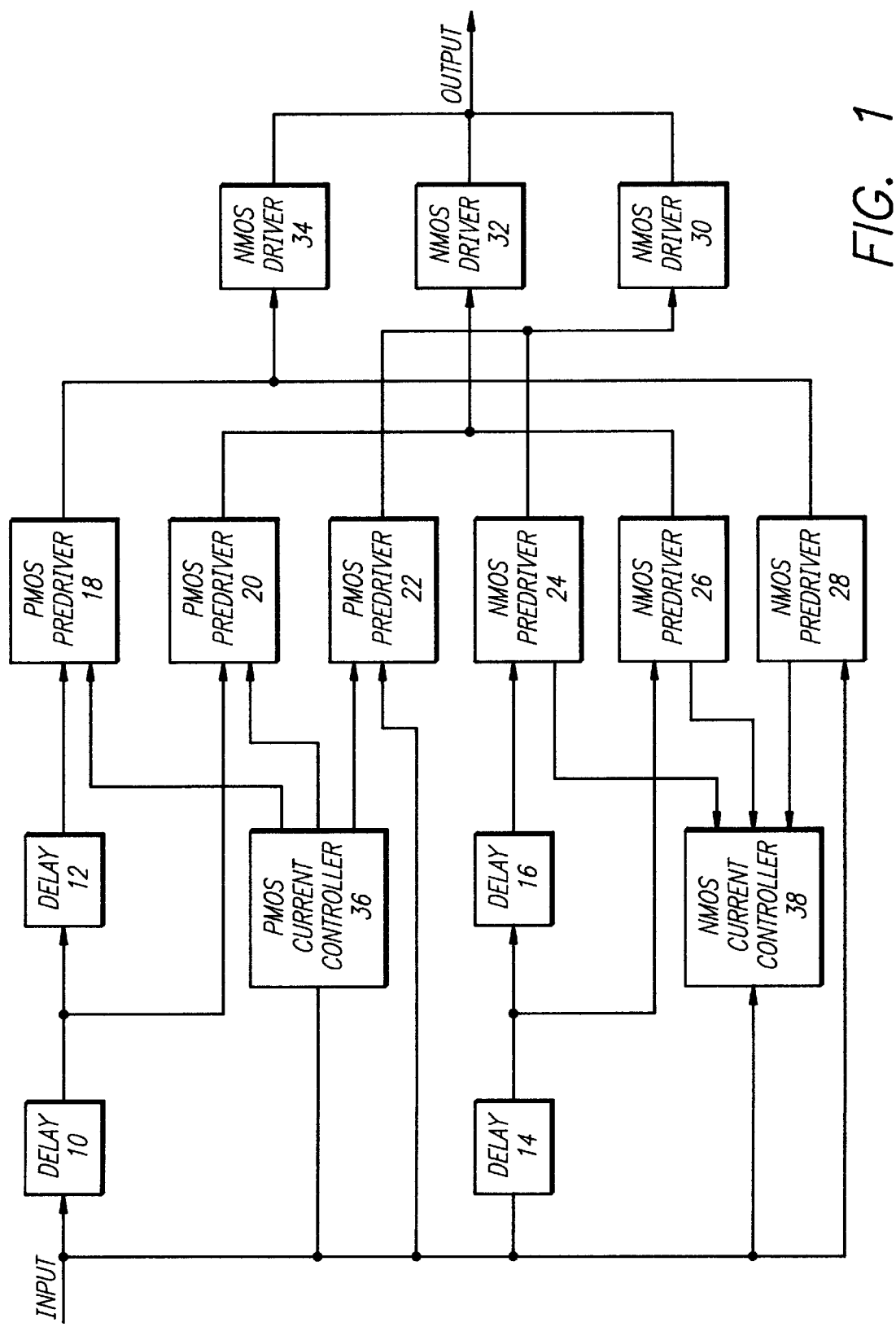
FIG. 1 illustrate the invention in block form.

As shown in FIG. 1, the output driver of the invention includes a delay element, N pull-down predrivers, N output devices, N pull-up predrivers, and two current controllers. In a preferred embodiment, N=3 and the delay element includes delays 10, 12, 14 and 16. The N pull-down predrivers include PMOS predrivers 18, 20 and 22. The N pull-up predrivers include NMOS predrivers 24, 26 and 28. The N output devices include NMOS drivers 30, 32 and 34.

The PMOS current controller 36 is connected to three PMOS predrivers respectively and functions to control the transient current flowing through three PMOS predrivers when three NMOS predrivers are OFF. The NMOS current controller 38 is connected to three NMOS predrivers respectively and functions to control the transient current flowing through three NMOS predrivers when three PMOS predrivers are OFF.

The delay element has N output terminals, responsive to the input signal, for generating N delayed signals. In particular, the input signal is input to the PMOS predriver 22 and NMOS predriver 28 directly without delay. The delay signal from the output terminal of delay 10 is input to the PMOS predriver 20. The delay signal from the output terminal of delay 12 is input to the PMOS predriver 18. The delay signal from the output terminal of delay 14 is input to the NMOS predriver 26. The delay signal from the output terminal of delay 16 is input to the NMOS predriver 24.

The output signal is generated by a combination of outputs provided by the three output NMOS drivers 30, 32 and 34. As noted, although the invention in FIG. 1 is described herein with reference to PMOS and NMOS elements, the invention may also be applied to other pull up and pull down devices.

Responsive to the input signal, trigger signals output from pull-down predrivers 22, 20 and 18 are sequentially generated in an order from 22, 20 to 18. The PMOS current controller 36 is connected to the three PMOS predrivers respectively and functions to control the transient cur rent flowing through the three PMOS predrivers when the three NMOS predrivers are OFF. Similarly, responsive to the input signal, trigger signals output from pull-up predrivers 28, 26 and 24 are sequentially generated in an order from 28, 26 to 24. The NMOS current controller 38 is connected to the three NMOS predrivers respectively and functions to control the transient current flowing through the three NMOS predrivers when the three PMOS predrivers are OFF. Therefore, the output NMOS drivers are triggered in order from NMOS driver 30, NMOS driver 32 and NMOS driver 34 in response to the trigger signals from pull-down predrivers 22, 20 and 18. And they are released in an opposite order, that is, from NMOS driver 34, NMOS driver 32 and NMOS driver 30, in response to the trigger signals from pull-up predrivers 28, 26 and 24.

Figure 2:
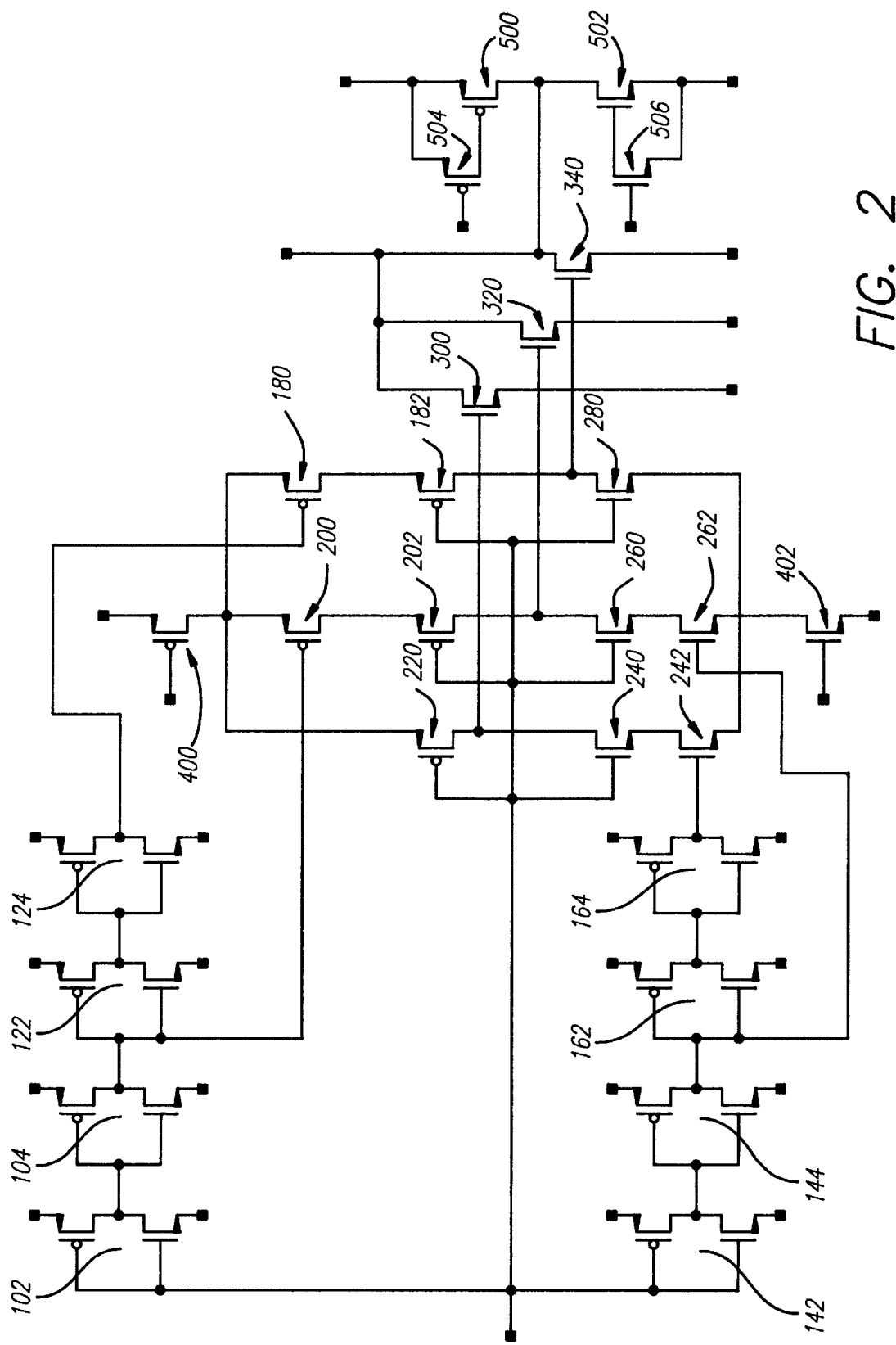
FIG. 2 illustrates one preferred embodiment of the invention.

A preferred embodiment of the output driver of FIG. 1 is illustrated in FIG. 2. In FIG. 2, the input signal comes in at terminal A and the output signal is formed at terminal Z. It is to be noted first that a passive pull-up resistor, not shown in FIG. 2, is provided on the output terminal Z for pulling up the signal level once the output line is released by the output driver.

With reference to FIG. 1 and FIG. 2, CMOS inverters 102 and 104 are connected to form the delay 10. CMOS inverters 122 and 124 are connected to form the delay 12. CMOS inverters 142 and 144 are connected to form the delay 14. CMOS inverters 162 and 164 are connected to form the delay 16.

Furthermore, PMOS transistor 220 functions as the PMOS predriver 22, and NMOS transistor 280 functions as the NMOS predriver 28. The cascade connected PMOS transistors 200, 202 together function as the PMOS predriver 20. The cascade connected PMOS transistors 180, 182 together function as the PMOS predriver 18. The cascade connected NMOS transistors 260, 262 together function as the NMOS predriver 26. The cascade connected NMOS transistors 240, 242 together function as the NMOS predriver 24. The NMOS transistor 300 functions as the NMOS driver 30, the NMOS transistor 320 functions as the NMOS driver 32 and the NMOS transistor 340 functions as the NMOS driver 34 respectively. The transistor 400 performs the function of the PMOS current controller 36 in FIG. 1 and the transistor 402 performs the function of the NMOS current controller in FIG. 1. As shown in FIG. 2, due to the current limiting function of the PMOS transistor 400, the current fluctuation phenomenon during the switching of the PMOS transistors 220, 200, 202, 180 and 182 will be furthermore minimized. As shown in FIG. 2, due to the current limiting function of the NMOS transistor 402, the current fluctuation phenomenon during the switching of the NMOS transistors 240, 242, 260, 262 and 280 will be furthermore minimized. The transistors 500, 502, 504 and 506 function as a protection circuit from static electricity which is irrelevant to main object of this invention.

In a preferred arrangement, relative sizes of three output NMOS transistors are so arranged that NMOS transistor 300 is smallest, NMOS transistor 320 is medium and NMOS transistor 340 is largest.

As the input signal at terminal A asserts a voltage downward transition, the PMOS predrivers are activated in an order from PMOS predrivers 22, 20 and 18. During this period, the NMOS predrivers are de-activated. As a result, the smallest transistor 300, i.e. NMOS driver 30, is triggered first, and then medium transistor 320, i.e. NMOS driver 32, is triggered second, and the largest transistor 340, i.e. NMOS driver 34 is triggered last. An example output signal during a pull down phase is shown in FIG. 3(A).

Figure 3B:
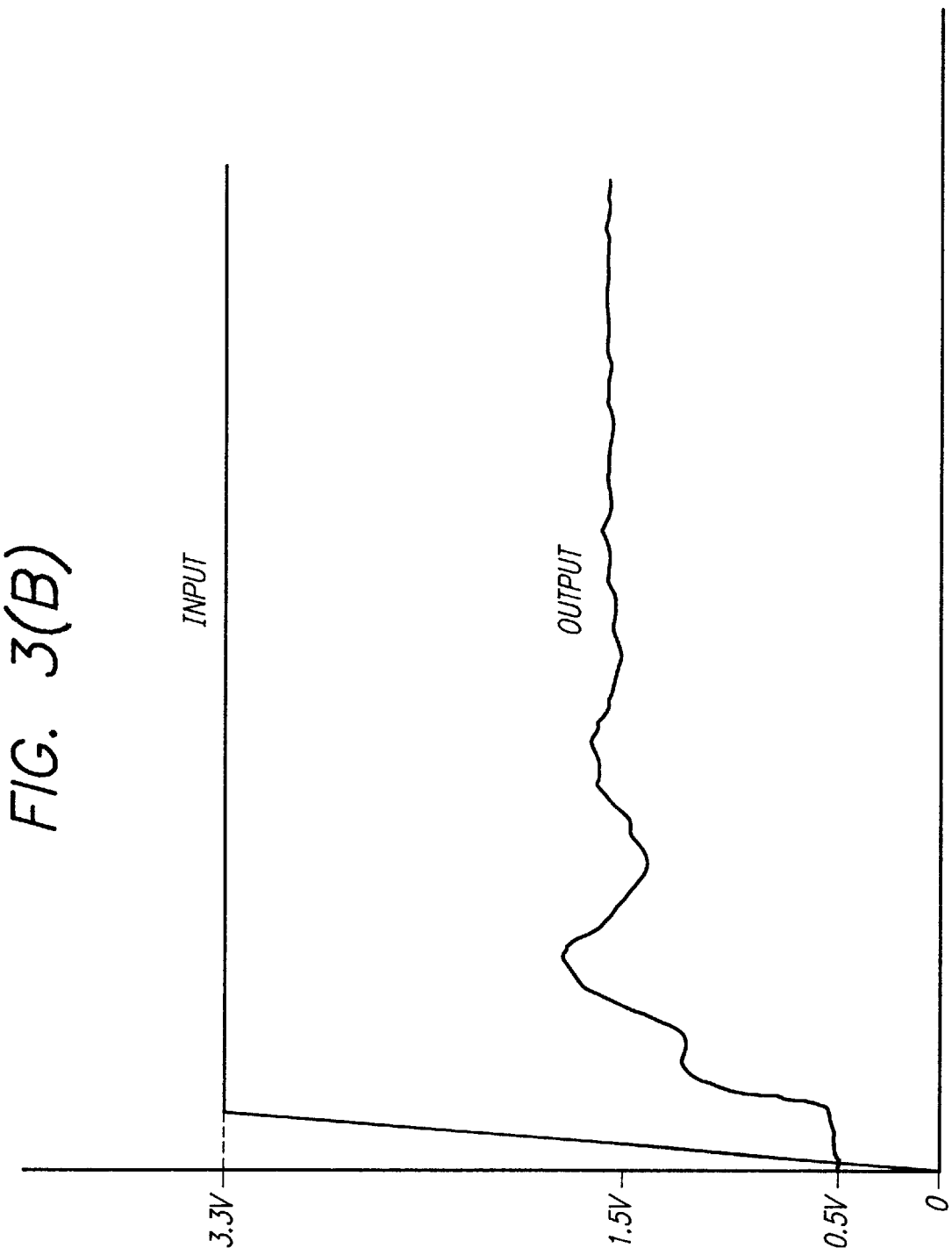
FIG. 3 (A) illustrates the output signal during a pull down phase of the input signal.

As the input signal at terminal A asserts a voltage upward transition, the PMOS predrivers are de-activated. During this period, the NMOS predrivers are activated in an order from NMOS predrivers 28, 26 and 24. As a result, the largest transistor 340, i.e. NMOS driver 34, is released first, and then medium transistor 320, i.e. NMOS driver 32, is released second, and the smallest transistor 300, i.e. NMOS driver 30 is released last. An example output signal during a pull up phase is shown in FIG. 3(B).

Figure 4:
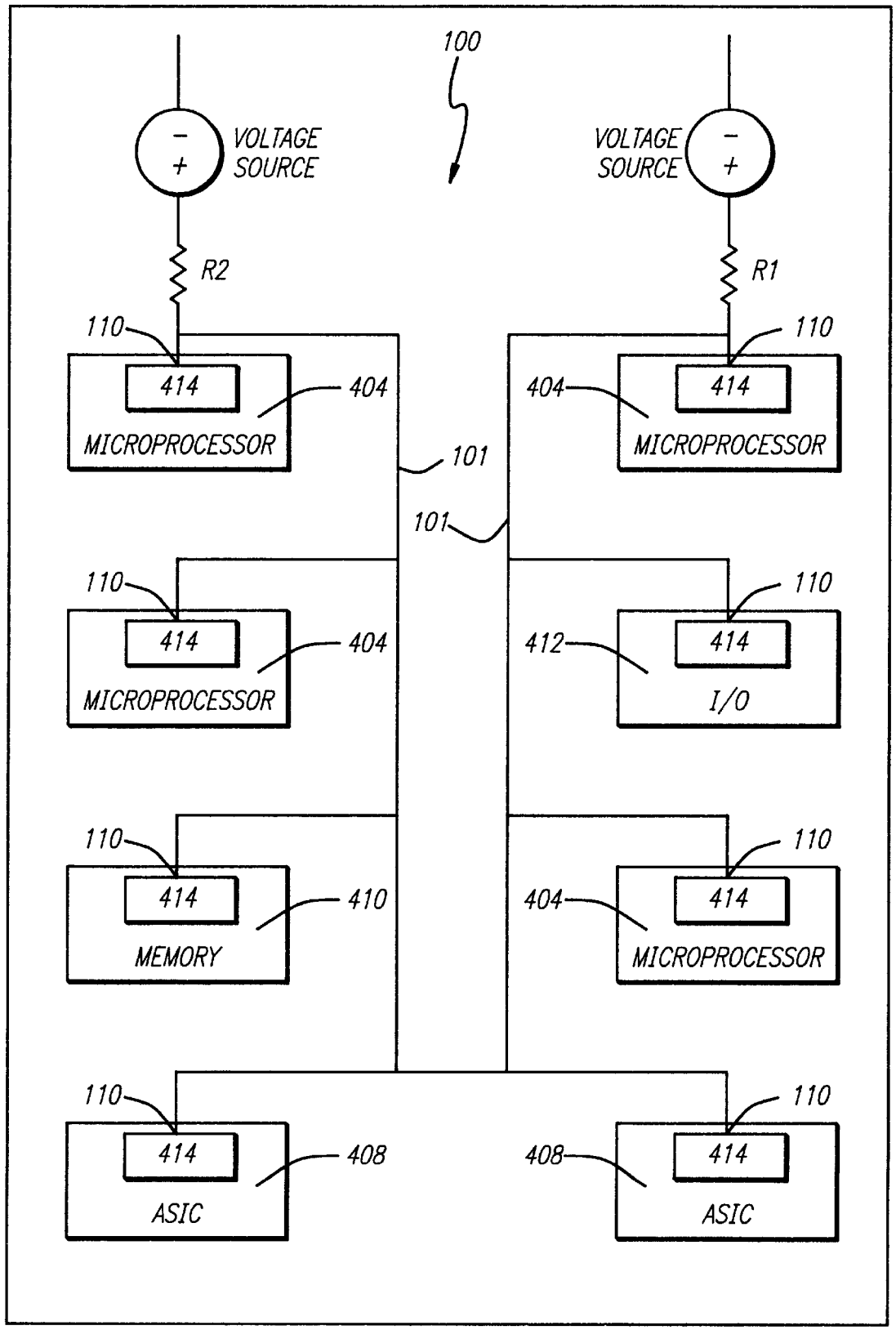
FIG. 4 illustrates a computer system incorporating signal drivers configured in accordance with the invention.

FIG. 4 illustrates an exemplary computer system 100 which incorporates signal drivers in accordance with the invention. As shown, the computer system 100 includes microprocessors 404, Application Specific Integrated Circuit (ASIC) devices 408, and a bus 101 interconnecting the microprocessors 404, the I/O device 412, the memory device 410 and the ASIC devices 408. It is to be noted that the basic structure shown in FIG. 1 is conventional except, however, the signal driver 414 within the ASICs 408 is constructed in accordance with the invention. Furthermore, each signal driver is connected through an interconnection line 110 to the bus 101. The resistors R1, R2 are the external passive pull-up resistors used for pulling up the signal level once the output line is released by the output driver 414, as described in the context of FIG. 2.

I claim:

1. A fast edge rate signal driver responsive to an input signal, comprising:

a delay circuitry arrangement responsive to the input signal, for generating a first set of N delay-incorporating signals including at least N–1 delayed signals and a second set of N delay-incorporating signals including at least N–1 delayed signals, with N an integer at least equal to 3;

N pull-down predrivers for selectively generating N trigger signals, each of the N pull-down predrivers respectively inputting one of the first set of N delay-incorporating signals and selectively generating a corresponding one of N trigger signals;

N output devices, each of the N output devices respectively receiving one of said N trigger signals, each of the N output devices having one output terminal, said output terminals coupled to provide an output terminal of said fast edge rate signal driver;

N pull-up predrivers for selectively generating N trigger signals, each of the N pull-up predrivers respectively inputting one of the second set of N delay-incorporating signals and selectively generating a corresponding one of N trigger signals;

said pull down predrivers selectively sequentially triggering activation of said N output devices in a first order;

said pull-up predrivers selectively sequentially triggering de-activation of said N output devices in a second order;

a PMOS current controller connected to the N pull-down predrivers for further limiting current fluctuation during said generation of said N trigger signals of the N pull-down predrivers; and an NMOS current controller connected to the N pull-up predrivers for further limiting current fluctuation during said generation of said N trigger signals of the N pull-up predrivers.

2. The fast edge rate signal driver of claim 1, wherein said output devices comprise transistors of different sizes.

3. The fast edge rate signal driver of claim 2, wherein said pull-down predrivers trigger activation of said transistors in order from smallest to largest and said pull-up predrivers trigger de-activation of said transistors in order from largest to smallest.

4. The fast edge rate signal driver of claim 1, wherein said pull-down predrivers comprise PMOS transistors and said pull-up predrivers comprise NMOS transistors.

5. The fast edge rate signal driver of claim 1, wherein substantially during said pull-down predrivers triggering activation of said output devices, said pull-up predrivers are de-activated.

6. The fast edge rate signal driver of claim 1, wherein substantially during said pull-up predrivers triggering de-activation of said output devices, said pull-down predrivers are de-activated.

7. A computer system comprising:

a microprocessor;

an Application Specific Integrated Circuit (ASIC) device;

a bus interconnecting the microprocessor and the ASIC device;

wherein the microprocessor and the ASIC device each includes a fast edge rate signal driver connected to the bus, the fast edge rate signal driver provided within the ASIC being responsive to an input signal and comprising:

a delay circuitry arrangement responsive to the input signal, for generating a first set of N delay-incorporating signals including at least N–1 delayed signals and a second set of N delay-incorporating signals including at least N–1 delayed signals, with N an integer at least equal to 3;

N pull-down predrivers for selectively generating N trigger signals, each of the N pull-down predrivers respectively inputting one of the first set of N delay-incorporating signals and selectively generating a corresponding one of N trigger signals;

N output devices, each of the N output devices respectively receiving one of said N trigger signals, each of the N output devices having one output terminal, said output terminals coupled to provide an output terminal of said fast edge rate signal driver;

N pull-up predrivers for selectively generating N trigger signals, each of the N pull-up predrivers respectively inputting one of the second set of N delay-incorporating signals and selectively generating a corresponding one of N trigger signals;

said pull-down predrivers selectively sequentially triggering activation of said N output devices in a first order;

said pull-up predrivers selectively sequentially triggering de-activation of said N output devices in a second order;

a PMOS current controller connected to the N pull-down predrivers for further limiting current fluctuation during said generation of said N trigger signals of the N pull-down predrivers; and an NMOS current controller connected to the N pull-up predrivers for further limiting current fluctuation during said generation of said N trigger signals of the N pull-up predrivers.

8. The computer system of claim 7, wherein said output devices comprise transistors of different sizes.

9. The computer system of claim 8, wherein said pull-down predrivers trigger activation of said transistors in order from smallest to largest and said pull-up predrivers trigger de-activation of said transistors in order from largest to smallest.

10. The computer system of claim 7, said pull-down predrivers comprise PMOS transistors and said pull-up predrivers comprise NMOS transistors.

11. The computer system of claim 7, wherein substantially during said pull-down predrivers' triggering activation of said output devices, said pull-up predrivers are de-activated.

12. The computer system of claim 7, wherein substantially during said pull-up predrivers' triggering de-activation of said output devices, said pull-down predrivers are de-activated.

13. A method for asserting signals onto an output line connected to a passive external pull-up resistor by using a fast edge rate signal driver having first, second and third pull-down predrivers, first, second and third pull-up predrivers, first and second delay elements, and first, second and third output devices, each of said output devices having one output terminal coupled to provide said output line, the fast edge rate signal driver further including a PMOS current controller connected to the first, second and third pull-down predrivers respectively for further limiting current fluctuation during switching of the first, second and third pull-down predrivers, the PMOS current controller having a control terminal, and the fast edge rate signal driver further including a NMOS current controller connected to the first, second and third pull-up predrivers respectively for further limiting current fluctuation during switching of the first, second and third pull-up predrivers, the NMOS current controller having a control terminal, said method comprising the steps of:

applying an input signal to the control terminals of the PMOS and NMOS current controllers for turning ON and OFF the PMOS and NMOS current controllers, and to the first pull-down predriver such that a first trigger signal output from the first pull-down predriver applies to the first output device;

passing the input signal through the first delay element to generate a first delayed signal which is applied to the second pull-down predriver, such that a second trigger signal output from the second pull-down predriver applies to the second output device;

passing the first delayed signal through the second delay element to generate a second delayed signal which is applied to the third pull-down predriver, such that a third trigger signal output from the third pull-down predriver applies to the third output device.

14. The method of claim 13, wherein the output devices comprise transistors of different sizes and the steps of applying trigger signals to the output devices are performed in order from smallest transistor to largest.

15. The method of claim 13, wherein the pull-down predrivers comprise PMOS transistors and the pull-up predrivers comprise NMOS transistors.

16. A method for asserting signals onto an output line connected to a passive external pull-up resistor by using a fast edge rate signal driver having first, second and third pull-down predrivers, first, second and third pull-up predrivers, first and second delay elements, and first, second and third output devices, each of said output devices having one output terminal coupled to provide said output line, the fast edge rate signal driver further including a PMOS current controller connected to the first, second and third pull-down predrivers respectively for further limiting current fluctuation during switching of the first, second and third pull-down predrivers, the PMOS current controller having a control terminal, and the fast edge rate signal driver further including a NMOS current controller connected to the first, second and third pull-up predrivers respectively for further limiting current fluctuation during switching of the first, second and third pull-up predrivers, the NMOS current controller having a control terminal, said method comprising the steps of:

applying an input signal to the control terminals of the NMOS and PMOS current controllers for turning ON and OFF the PMOS and NMOS current controllers, and to the first pull-up predriver such that a first trigger signal output from the first pull-up predriver applies to the first output device;

passing the input signal through the first delay element to generate a first delayed signal which is applied to the second pull-up predriver, such that a second trigger signal output from the second pull-up predriver applies to the second output device;

passing the first delayed signal through the second delay element to generate a second delayed signal which is applied to the third-pull-up predriver, such that a third trigger signal output from the third pull-up predriver applies to the third output device.

17. The method of claim 16, wherein the output devices comprise transistors of different sizes and the steps of applying trigger signals to the output devices are performed in order from largest transistor to smallest.

18. The method of claim 16, wherein the pull-down predrivers comprise PMOS transistors and the pull-up predrivers comprise NMOS transistors.

* * * * *

UNITED STATES PATENT AND TRADEMARK OFFICE
CERTIFICATE OF CORRECTION

PATENT NO. : 5,825,219
DATED : October 20, 1998
INVENTOR(S) : Cheng-Hsien Tsai

It is certified that error appears in the above-identified patent and that said Letters Patent is hereby corrected as shown below: On the title page, Item [73],

The assignee's name is misspelled. Please change from Silicon Integrated SyStem Corp. to Silicon Integrated System Corp.

Signed and Sealed this

Twenty-second Day of June, 1999

Attest:

Q. TODD DICKINSON

*Attesting Officer*     Acting Commissioner of Patents and Trademarks

UNITED STATES PATENT AND TRADEMARK OFFICE
CERTIFICATE OF CORRECTION

PATENT NO. : 5,825,219
DATED : October 20, 1998
INVENTOR(S) : Cheng-Hsien Tsai

It is certified that error appears in the above-identified patent and that said Letters Patent is hereby corrected as shown below: Title page, item [73]

The assignee's name is misspelled. Please change from "Silicon Integrated System Corp." to "Silicon Integrated Systems Corp."

This certificate supersedes Certificate of Correction issued June 22, 1999.

Signed and Sealed this

Nineteenth Day of October, 1999

Attest:

Q. TODD DICKINSON

Attesting Officer

Acting Commissioner of Patents and Trademarks